(12) United States Patent
Lee

(10) Patent No.: US 6,813,184 B2
(45) Date of Patent: Nov. 2, 2004

(54) NAND FLASH MEMORY AND METHOD OF ERASING, PROGRAMMING, AND COPY-BACK PROGRAMMING THEREOF

(75) Inventor: June Lee, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/340,532

(22) Filed: Jan. 10, 2003

(65) Prior Publication Data

US 2003/0133340 A1 Jul. 17, 2003

(30) Foreign Application Priority Data

Jan. 12, 2002 (KR) .......................................... 2002-1875

(51) Int. Cl.[7] .............................................. G11C 16/06
(52) U.S. Cl. ................ 365/185.09; 365/200; 365/238.5
(58) Field of Search ............................ 365/185.09, 200, 365/238.5, 230.08, 189.05, 233

(56) References Cited

U.S. PATENT DOCUMENTS

| | | | |
|---|---|---|---|
| 5,712,818 A | 1/1998 | Lee et al. | |
| 5,761,132 A | 6/1998 | Kim | |
| 5,790,458 A | 8/1998 | Lee et al. | |
| 5,996,041 A | 11/1999 | Kim | |
| 6,473,339 B2 | * 10/2002 | De Ambroggi et al. | . 365/185.09 |

FOREIGN PATENT DOCUMENTS

KR 1020010029546 4/2001

* cited by examiner

Primary Examiner—David Lam
(74) Attorney, Agent, or Firm—Marger Johnson & McColom, P.C.

(57) ABSTRACT

The disclosure is a NAND flash memory including a data loading circuit providing a program data bit into a page buffer having first and second latches. During a data loading operation for programming, the data loading circuit puts a pass data bit into a page buffer corresponding to a defective column, instead of a program data bit that is assigned to the defective column, responding to information of a column address involved in the defective column. It is available to provide a pass/fail check circuit for program-verifying without employing a fuse arrangement, making data of the defective column not affect a program-verifying result.

19 Claims, 10 Drawing Sheets

NAND FLASH MEMORY AND METHOD OF ERASING, PROGRAMMING, AND COPY-BACK PROGRAMMING THEREOF

This application claims priority from Korean Patent Application No. 2002-1875, filed on Jan. 12, 2002, the contents of which are herein incorporated by reference in their entirety for all purposes.

TECHNICAL FIELD

This disclosure generally relates to semiconductor memories, and more specifically, to a NAND flash memory having verifying functions for data bits held in page buffers during operation modes of programming, erasing, and copy-back programming.

BACKGROUND

A NAND flash memory, a kind of nonvolatile memory, employs page buffers for latching data (i.e., page data) assigned to a selected page during a read operation, which is referred to as a "sensing operation" of the page buffers, while storing data (i.e., program data) supplied from the external during a programming operation, which is referred to as a "data loading operation" of the page buffers. Further, the page buffers contribute to prevent program-inhibited cells or programmed cells from being programmed undesirably. When a verifying operation that is checking whether a memory cell is programmed or erased reaches its target (or desired) threshold voltage level, the page buffers detect data bits of memory cells of a selected page, and latch those voltage values. Then, the page buffers provide their data bits into a pass/fail check circuit to confirm those data bits are pass data bits informing of an successive programming or erasing.

Such page buffers have been disclosed in U.S. Pat. No. 5,790,458 entitled "Sense amplifier for nonvolatile semiconductor memory device", U.S. Pat. No. 5,761,132 entitled "Integrated circuit memory devices with latch-free page buffers therein for preventing read failures", and U.S. Pat. No. 5,712,818 entitled "Data loading circuit for partial program of nonvolatile semiconductor memory".

One of the known page buffers is shown in FIG. 1. The page buffer of FIG. 1 is connected to a pair of bitlines BLe and BLo, including a pair of latches LAT1 and LAT2 (main and cache). NMOS transistors M1~M4 form a bitline selection and biasing circuit, which connects one of the bitlines to a sensing node SO and causes the other bitline to be in a floating state. Between the bitline BLe and a sensing node SO is an NMOS transistor M1 that responds to a control signal BLSHFe. Between the bitline BLo and the sensing node SO is an NMOS transistor M2 that responds to a control signal BLSHFo. An NMOS transistor M3 is connected between the bitline BLe and a control signal line VIRPWR and an NMOS transistor M4 between BLo and VIRPWR. The NMOS transistors M3 and M4 respond to control signals VBLe and VBLo, respectively. The transistors M1~M4 form a bitline selection and biasing circuit to connect one of the bitlines to the sensing node SO and causes the other bitline be in a floating state.

Between a power supply voltage VCC and the sensing node SO is a PMOS transistor M5 that responds to a control signal PLOAD. A PMOS transistor M6 is connected between VCC and a main latch node nB of the main latch LAT1, controlled by a signal PBRST. Between the latch node nB and a ground voltage VSS are NMOS transistors M7 and M8, in series, responding to a voltage level of the sensing node SO and a control signal PBLHCM, respectively. A PMOS transistor M9 is connected between VCC and an output terminal nWDO, being turned on or off responsively to a logic state of a main latch node B. The output terminal nWDO is led to a pass/fail check circuit shown in FIG. 2. A logic state of the output terminal nWDO is complementary to that of the main latch node B. For instance, the output terminal nWDO is connected to VCC when the main latch node B has a low level. Otherwise, the output terminal nWDO is electrically isolated from VCC, in a floating state, when the main latch node B is set at a high level.

An NMOs transistor M10 connected between the sensing node SO and the main latch node B of the main latch LAT1 responds to the signal BLSLT. Between an internal node ND1 and the main latch node B is an NMOS transistor M11 responding to a signal PBDO. A PMOS transistor M12 is connected between VCC and a cache latch node A of the cache latch LAT2, responding to a signal PBSET. An NMOS transistor M13 is connected between the cache latch node A and the sensing node SO, responding to a signal PDUMP. Between the main latch node A and VSS are NMOS transistors M14 and M15 in series. The NMOS transistors M14 and M15 respond to a logic state of the sensing node SO and a signal PBLCHC respectively. Between the internal node ND1 and a cache latch node nA (a counter node of A) of the cache latch LAT2 is an NMOS transistor M16 and between the internal node ND1 and the cache latch node A is connected to an NMOS transistor M17. The NMOS transistors M16 and M17 respond to data signals DLi and nDLi, complementary to each other, respectively.

When a program data bit is "1" (as a binary code) to be loaded in the page buffer circuit of FIG. 1, the data signal DLi is logically set to a high level while the data signal nDLi is established at a low level. The internal node ND1 is connected to a data line DLi through NMOS transistors M18 and M19 those form a column gate circuit responding to column selection signals YA and YB respectively. Between the data line DLi and the ground voltage is an NMOS transistor M20, responding to a signal DLD.

The page buffer shown in FIG. 1 is operable in erasing, programming, reading, and copy-back programming modes. The copy-back programming is referred to an operation of moving data stored in a page into another page, having been proposed in U.S. Pat. No. 5,996,041 entitled "Integrated circuit memory devices having page flag cells which indicate the true of non-true state of page data therein and methods of operating the same".

In programming with the page buffer of FIG. 1, a program data bit is loaded into the latch LAT2. For instance, if a program data bit is "1", a data signal DLi becomes a high level while a data signal nDLi becomes a low level. The NMOS transistor M16 is turned on while an NMOS transistor M17 is turned off. At the same time, NMOS transistors M18 and M19 are turned on by column selection signals YA and YB, thereby connecting the latch node nA to the data line DLi through M18 and M19. For loading the program data bit, the data line DLi is connected to a ground voltage through the NMOS transistor M20. Thus, the program data bit of "1" is loaded into the latch node A. If a program data bit is "0", the data signal DLi becomes a low level while the data signal nDLi becomes a high level. As the NMOS transistor M17 connects the latch node A to the data line DLi that is at the ground voltage, the program data bit "0" is loaded into the latch node A. Through the aforementioned procedure, all program data bits are loaded into the page buffers in sequence.

After completing the loading operation of the program data bit into the cache latch LAT2, the data bit is transferred to the main latch LAT1. First, the main latch LAT1 is initiated by a turn-on of an NMOS transistor M6 and the sensing node SO is charged up to a high level by a PMOS transistor M5. And then, an NMOS transistor M13 is turned on to transfer the program data bit from LAT2 to LAT1. If the program data bit of "1" has been loaded in the cache latch LAT2, it is latched at a node B of LAT1 when NMOS transistors M7 and M8 are turned on. On the contrary, when the program data bit of "0" is loaded in the cache latch LAT2, the NMOS transistor M7 is turned off and thereby the node B of LAT1 maintains its initial state regardless of a turn-on of the NMOS transistor M8 by a control signal PBLCHM.

The program data bit loaded in the main latch LAT1 is put into a program operation for a selected bitline for which a selected memory cell will be programmed, while the other non-selected memory cells will be program-inhibited. During programming with the data bit held in the main latch LAT1, the cache latch LAT2 as a cache brings the next program data bit thereto.

The main latch LAT1 detects data bits stored in memory cells belonging to a selected page during a read operation or a program-verifying operation, while the cache latch LAT2 does so during a copy-back program operation or an erasure-verifying operation.

In the read or program-verifying operation, once the bitlines BLe and BLo and the sensing node SO have been discharged, a selected bitline (e.g., BLe) is placed in a floating state after being charged up to a predetermined voltage. While this occurs, the bitline voltage will be reduced or maintains its prior level. A current is supplied to the node SO through the NMOS transistor M5 while the NMOS transistor M1 is conductive. If the selected memory cell is an on-cell, the current of the node SO flows out through a channel path of the selected memory cell, resulting in lowering the voltage of the node SO below the threshold voltage of the NMOS transistor M7. The latch LAT1 does not vary its voltage state although the NMOS transistor M8 is turned on. If the selected memory cell is an off-cell, the current from the NMOS transistor M5 contributes to increase the voltage at the node SO gradually up to a higher level over the threshold voltage of the NMOS transistor M7. During the time NMOS transistor M8 is conductive, the latch node B is connected to the ground voltage to reverse or maintain the logical state of the main latch LAT1.

In a copy-back program or an erasure-verifying operation, the cache latch LAT2 detects data bits stored in memory cells of a selected page and then transfers the sensed result to the main latch LAT1. In detail, the bitlines BLe and BLo and the sensing node SO are discharged and the selected bitline (e.g., BLe) is caused to float after being charged up to a predetermined voltage. With a turn-on of the NMOS transistor M1, a current is supplied to the node SO through the PMOS transistor M5. If a selected memory cell is an on-cell, the current supplied to the node SO flows out through the selected memory cell, resulting in the voltage at the node SO under the threshold voltage of the selected memory cell. The main latch LAT1 maintains the current state although the NMOS transistor M15 may turn on by a transition of the control signal PBLCHC from a low level to a high level. If the selected memory cell is an off-cell, the current from the PMOS transistor M5 charges the sensing node SO gradually, resulting in an increase of the voltage of the node SO over the threshold voltage of the NMOS transistor M14. The NMOS transistor M15 is turned on to reverse a logic state of the cache latch LAT2. Thereby, the cache latch LAT2 detects a state of the selected memory cell, which is transferred to the main latch LAT1.

Programming or erasing accompanies a verifying operation to confirm whether a memory cell programmed or erased is settled at a predetermined threshold voltage. The result of programming or erasing a memory cell of a selected page is decided by a logic state held in the main latch LAT1, together with a pass/fail check circuit shown in FIG. 2. The pass/fail check circuit 2 of FIG. 2, which is a wired-OR type, generally includes multiple fuses F1~Fk, an NMOS transistor M21, an inverter INV5, and a latch LAT3. The fuses are connected to output terminals nWDO of page buffers 3, each to a group of the page buffers. Each fuse is blown when there is at least a defect in its corresponding bitlines.

The output terminal nWDO assigned to each page buffer is set by the latch node A of the main latch LAT1 (FIG. 1). For instance, if the latch node A is set at a high level, the PMOS transistor M9 is turned on to make the output terminal nWDO a high level, informing that the selected memory cell is completely programmed or erased. In this case, a node ND2 maintains a low level to make a pass/fail signal PF a low level. If the latch node A is at a low level, the PMOS transistor M9 is turned off, informing that the selected memory cell is not yet fully programmed or erased yet. In this case, the high level of the node ND2 makes the pass/fail signal PF a high level.

Because one fuse is assigned to a group of page buffers or bitlines (because it is impossible to associate them to each single page buffer with the present design techniques), it is inevitable to abandon plural page buffers connected to the blown-out fuse when one of bitlines corresponding thereto has a defect. Such a condition for the fusing architecture needs a more topological dimension, reducing layout efficiencies, as well as increasing a size of a redundant cell array.

Another technique for verifying the results of programming or erasing, free from the disadvantages with the fuses, is "column scanning", which has been proposed in Korean Patent Laid-open No. 2001-029546 entitled "Flash memory device with a program state detecting circuit and program method thereof". In the manner of the column scanning, page buffers store states of memory cells of a selected page after the memory cell states are detected, and then the data bits held in the page buffers are sequentially transferred to a pass/fail check circuit through a column pass circuit (e.g., NMOS transistors M19 and M20 of FIG. 1) by the unit of byte or word in response to an increment of column addresses. During this, a data bit from a page buffer corresponding to a defective column is not accessible because the defective column is substituted with a redundant column by a column address containing its defect information.

However, the column scanning may not be operationally available with the kind of the page buffer 10 shown in FIG. 1 because the cache latch LAT2 is connected to a program data bit of another page during a program operation by the main latch LAT1. As stated above, the cache latch LAT2 is conductive together with the data line DLi in loading a program data bit, which may cause a data conflict between a loading data bit and verifying data bit.

SUMMARY OF THE INVENTION

Embodiments of the invention provide a flash memory enhancing efficiencies of verifying operations for programmed or erased memory cells without fuses.

Thus, embodiments can provide a flash memory capable of performing operations of programming, erasing, and copy-back programming, with loading pass data in page buffers corresponding to defective columns.

Additionally, embodiments of the invention provide enhancement efficiencies to a flash memory for verifying operations for programmed or erased memory cells by loading pass data in page buffers corresponding to defective columns.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components.

DESCRIPTION OF THE PREFERRED EMBODIMENTS

It should be understood that the description of the preferred embodiment is merely illustrative and that it should not be taken in a limiting sense. In the following detailed description, several specific details are set forth in order to provide a thorough understanding of the present invention. It will be obvious, however, to one skilled in the art that the present invention may be practiced without these specific details.

Now, practical embodiments of the invention will be explained in conjunction with the drawings FIGS. 3 through 10. In the practical use of the invention, although the page buffer circuit shown in FIG. 1 can be used in embodiments of the invention, it may be possible to use the other type of a page buffer circuit employing a pair of main and cache latches in a single page buffer.

Figure 3:
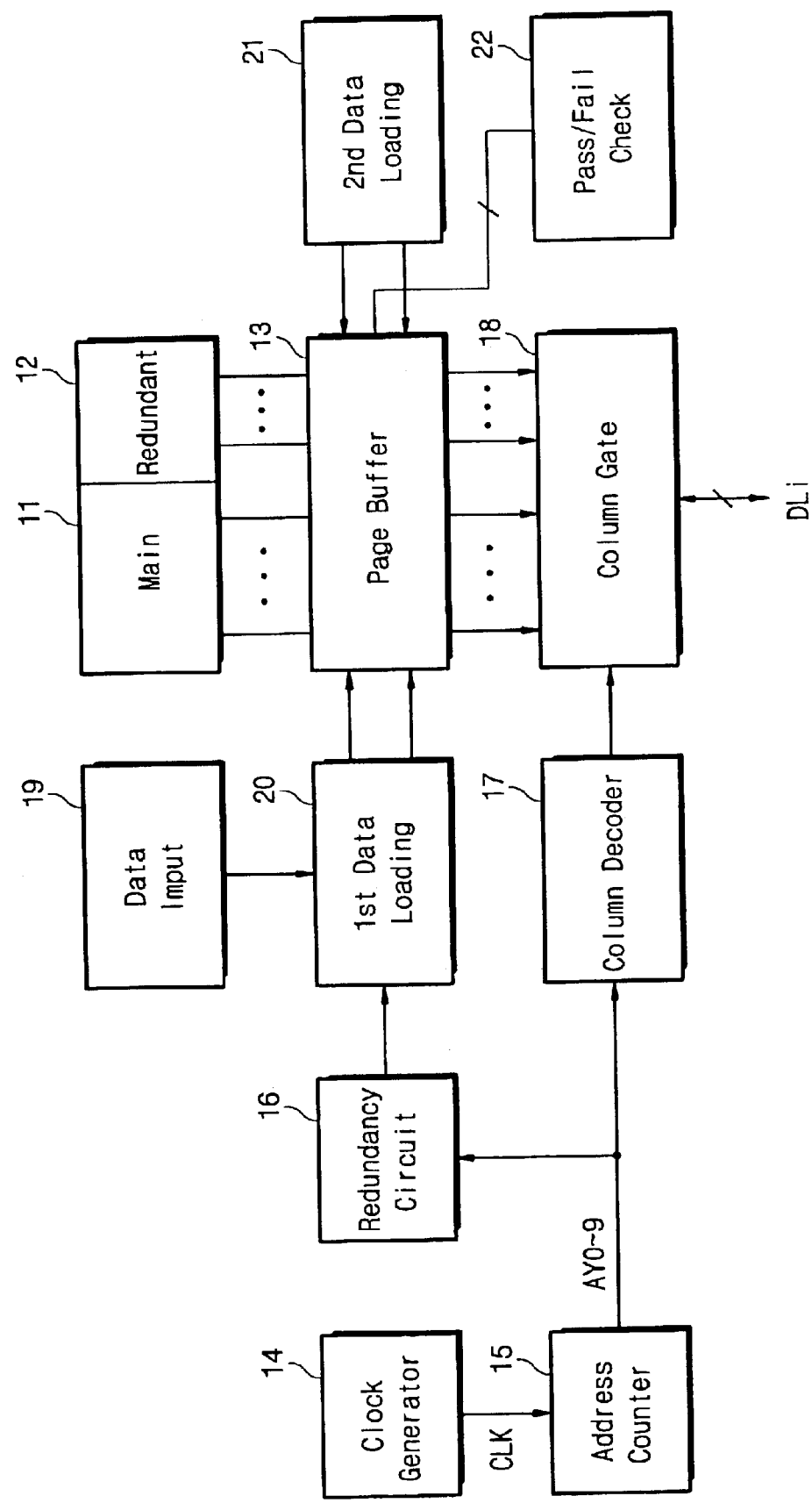
FIG. 3 is a block diagram of a NAND flash memory according to an embodiment of the invention.

FIG. 3 shows a functional structure of a NAND flash memory according to an embodiment of the present invention. The NAND flash memory includes a main cell array 11, a redundant cell array 12, a page buffer circuit 13, a clock generator 14, an address counter 15, a redundancy circuit 16, a column decoder 17, a column gate circuit 18, a data input buffer 19, a first data loading circuit 20, a second data loading circuit 21, and a pass/fail check circuit 22. Each cell array is formed of a plurality of NAND strings, each of which is connected to main bitlines and redundant bitlines. Each NAND string is formed of a string selection transistor, a common source line, a ground selection transistor, and a series of memory cells connected between the string and ground selection transistors.

Figure 1:
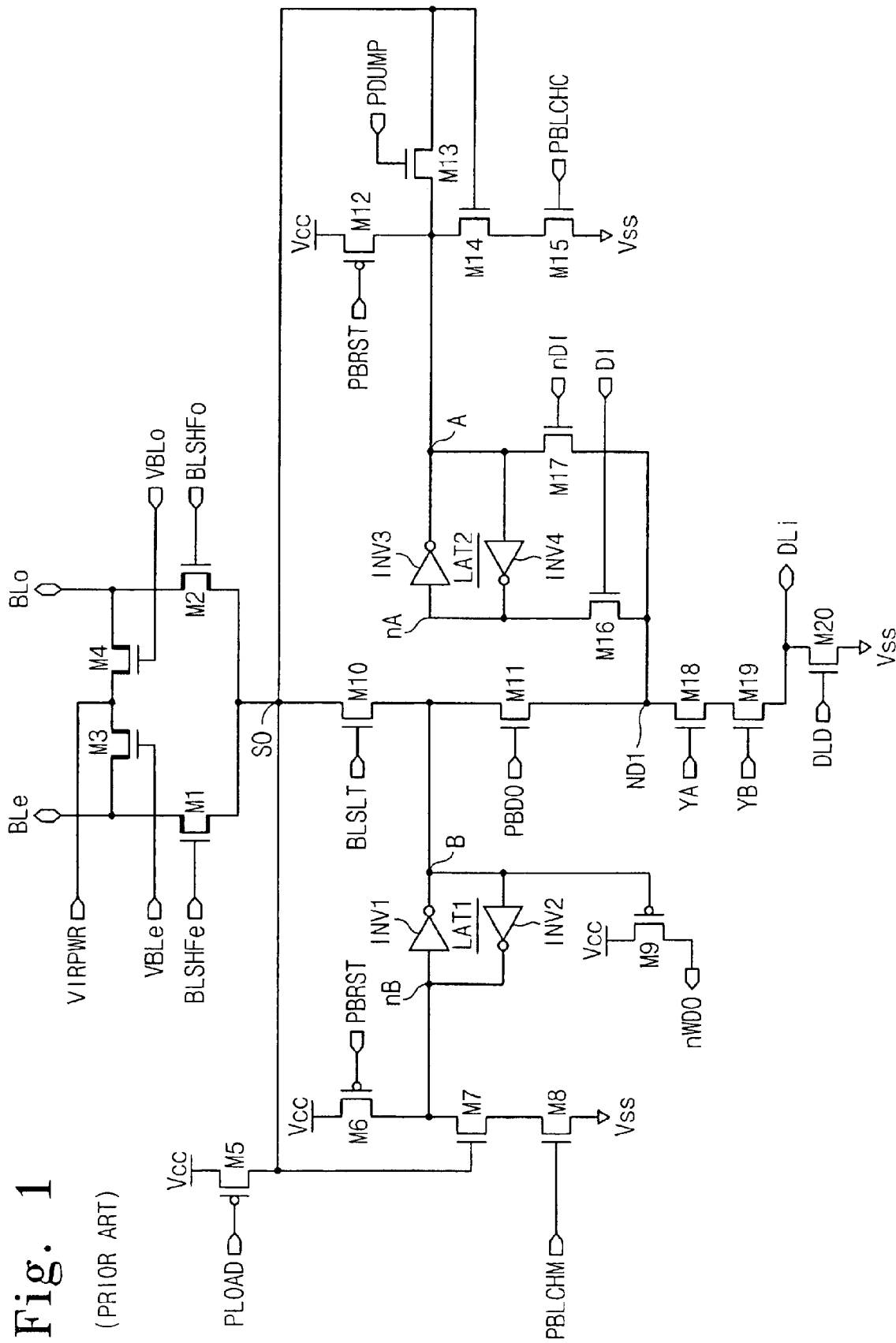
FIG. 1 is a schematic diagram of a conventional page buffer employed in a NAND flash memory.

The page buffer circuit 13 is constructed of a plurality of page buffers connected to the cell arrays through the main and redundant bitlines. Each page buffer is arranged to correspond to a pair of the bitlines (e.g., as shown in FIG. 1). The page buffer of the circuit 13 will be referred to that shown in FIG. 1 throughout the following description for an embodiment of the invention. The clock generator 14 creates a clock signal CLK to be used for operational modes of the NAND flash memory. The clock generator 14 is active to generate the clock signal CLK, and is synchronized with a falling transition of an external write enable signal nWEx for loading program data in the page buffer circuit 13, with a falling transition of an external read enable signal nREx for outputting data from the page buffer circuit 13 in series, or with an internal oscillation signal for loading pass data on a page buffer corresponding to a defective column during a copy-back programming or erasing operation. The address counter 15 generates column address signals synchronized with the clock signal CLK supplied from the clock generator 14.

Figure 4:
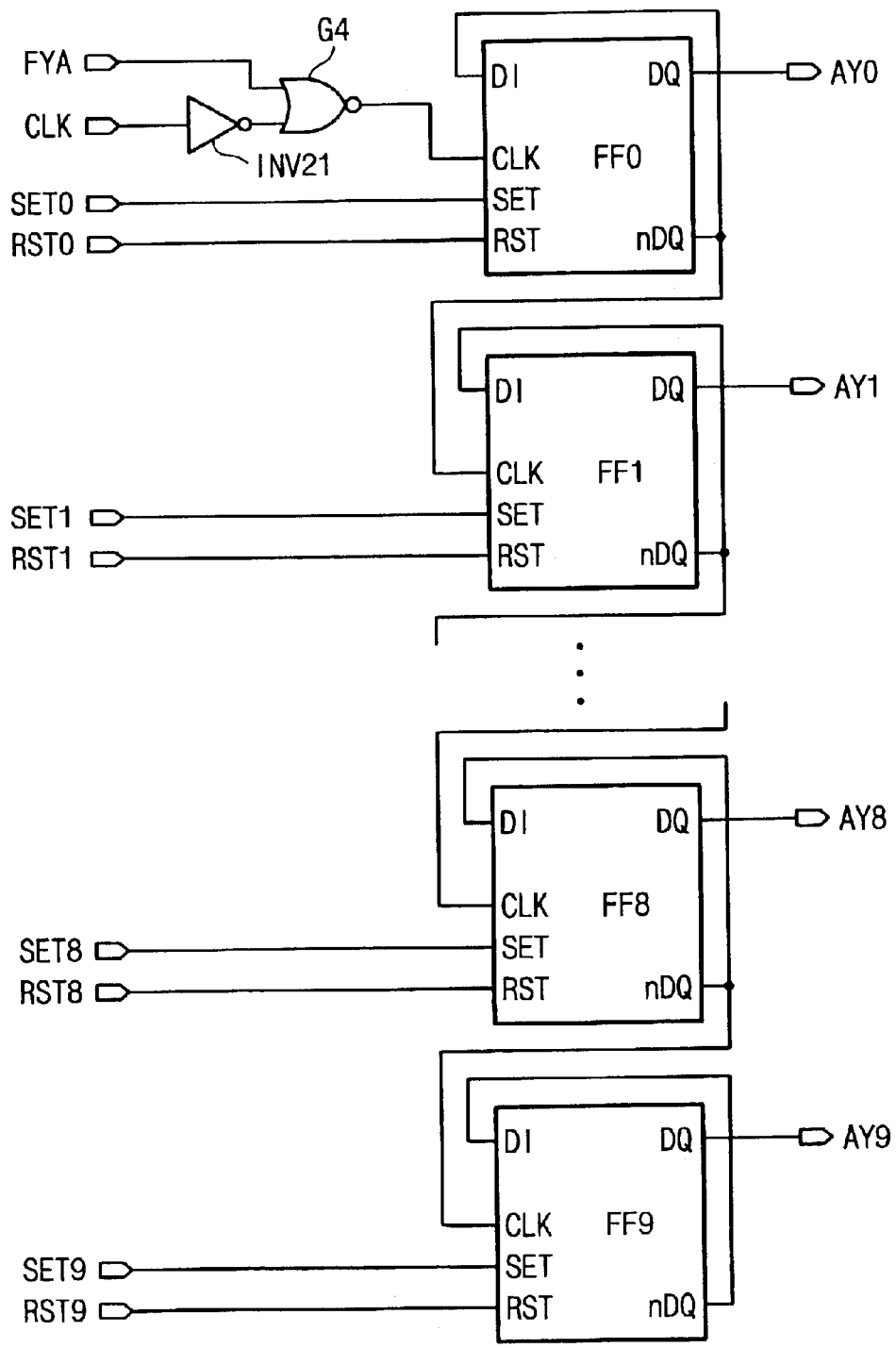
FIG. 4 is a circuit diagram of an address counter that can be used in the circuit of FIG. 3.

Referring to FIG. 4, the address counter 15 can be formed of an inverter INV21, a NOR gate G4, and a plurality of D-flipflops FF0~FF9 each having terminals for an input data bit DI, the clock signal CLK, a set signal SET, a reset signal RST, and outputs DQ and nDQ. When a control signal FYA is at low level, (informing that a current column address is the final one), the address counter 15 sequentially generates column address signals AY0~AY9, which form a unit of column address. If the control signal FYA has a high level, the column address signals AY0~AY9 are not generated, i.e., the address counter 15 is in a non-conductive state.

The redundancy circuit 16 (FIG. 3) stores column addresses designating defective ones (or bitlines) among columns of the main cell array 11, and compares a column address of the address counter 15 with the defective column address. If a current column address from the counter 15 matches the detective one, the redundancy circuit 16 activates one of redundant selection signals to designate the defective column. The column decoder 17 and the column gate circuit 18 select a part of the page buffers to connect them to their corresponding data lines DLi.

Figure 5:
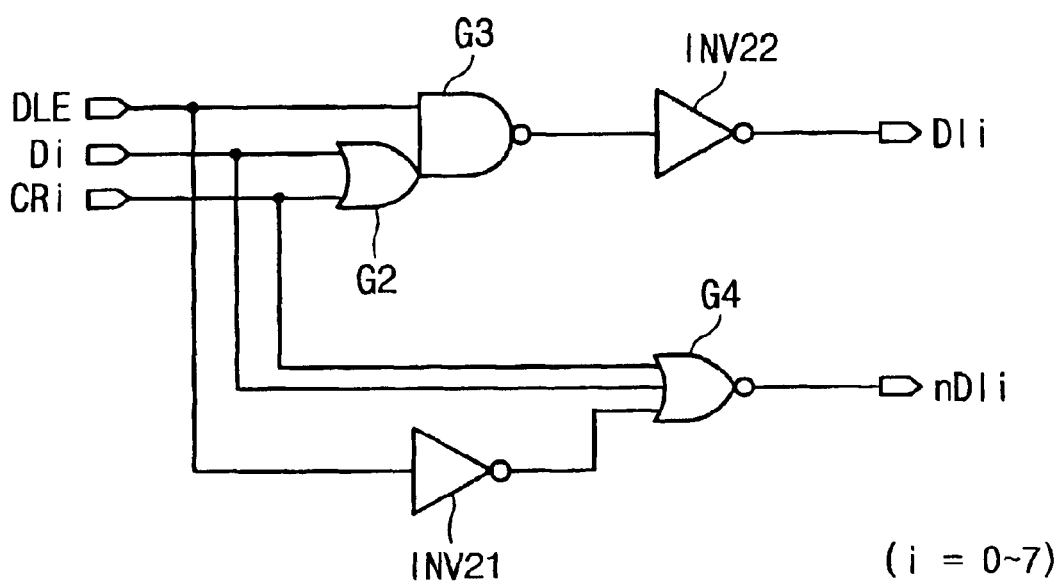
FIG. 5 is a circuit diagram of a first data loading circuit that can be used in the circuit of FIG. 3.

The data input buffer 19 receives program data bits to be loaded into the page buffer circuit 13 in the unit of byte or word. The first data loading circuit 20 transfers the program data bits from the data input buffer 190 to latches (e.g., LAT2 of FIG. 1) of selected page buffers. Referring to FIG. 5, the first data loading circuit 20 includes an OR gate G2, a NAND gate G3, a NOR gate G4, and inverters INV21 and INV22. A program data bit Di and redundant selection signal CRi are applied to an input of the OR gate G2 whose output is applied to an input of the NAND gate G3 together with a data loading enable signal DLE. An output of the NAND gate G3, is transferred to the page buffer circuit 13 (e.g., to the gate of the NMOS transistor M16 of FIG. 1) through the inverter INV22 as a data signal DLi. The NOR gate G4 receives the signal DLE through the inverter INV21, the program data bit Di, and the redundant selection signal CRi, and outputs a data signal nDLi to be transferred to the page buffer circuit 13 (e.g., to the gate of the NMOS transistor M17). The data loading circuit 20 corresponds to one data bit. The data loading enable signal DLE is active while program data bits are being loaded in the page buffer circuit 13, as well as during pass data loading terms in a copy-back programming or erasing operation.

When the signal DLE is being a high level, the data signals DLi and nDLi are logically set by the program data bit Di or the redundant selection signal CRi. If the program data bit Di is "1" and the redundant selection signal CRi is a low level, the data signal DLi becomes a high level while nDLi becomes a low level. If the program data bit Di is "0" with the low-level of the redundant selection signal CRi, the data signal DLi becomes a low level while nDLi becomes a high level. With a high level of the redundant selection signal CRi, the data signal DLi maintains a high level regardless of a present binary state of the program data bit Di, "0" or "1". That makes the latch node A of the cache latch LAT2 be connected to a data bit "1" (or a pass data bit) to be transferred to the main latch LAT1.

Figure 6:
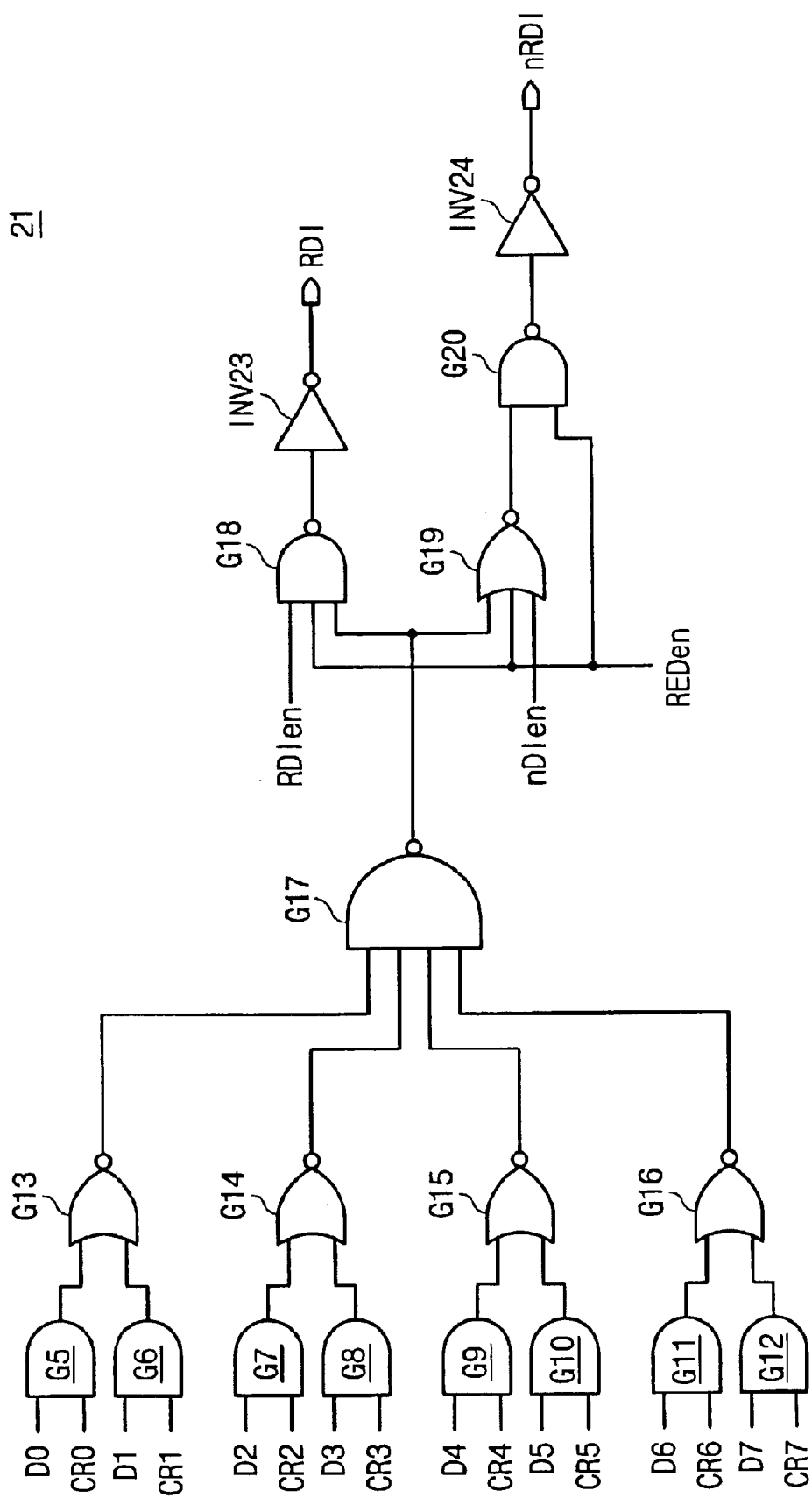
FIG. 6 is a circuit diagram of a second data loading circuit that can be used in the circuit of FIG. 3.

The second data loading circuit 21 (FIG. 6) loads a program data bit, corresponding to a defective column, among present program data bits, to a page buffer assigned to the redundant cell array 12 (i.e., "a redundant page buffer") when program data bits are being loaded into page buffers assigned to the main cell array 11 (i.e., "main page buffers"). Referring to FIG. 6, the second data loading circuit 21 includes AND gates G5~G12, NOR gates G13~G16 and G19, NAND gates G17, G18, and G20, and inverters INV23 and INV24. Control signals put into the second data loading circuit 21, RDIen and nDIen, logically complementary from each other, are active together with the data loading enable signal DLE while programming. The control signal nDIen is a low active signal. A control signal REDen, i.e., a redundancy enable signal, applied to inputs of the gates G18~G20 becomes active when a defective column address is found by the redundancy circuit 16. Redundant data signals RDI and nRDI are applied to the page buffer (e.g., to the gates of the NMOS transistors M16 and M17 of FIG. 1) in common. During an active state of the redundancy enable signal REDen, one of the page buffers will be connected to a data line corresponding to a defective column through the column gate circuit 18.

During a sequential loading operation with program data by the byte unit, the control signals RDIen and nDIen are set on high and low levels respectively. If a present column address is a defective one, one of the redundant selection signals CR0~CR7, e.g., CR0, becomes active. At this time, the redundancy enable signal REDen goes to a high level from a low level. Assuming that a program data bit (e.g., D1) corresponding to a defective column is "1", the NAND gate G17 outputs a high level signal to make the redundant data signals RDI and nRDI be high and low levels respectively. If the program data bit D1 corresponding to the defective column is "0", the NAND gate G17 outputs a low-leveled signal to set the redundant data signals RDI and nRDI on low and high levels respectively.

Figure 2:
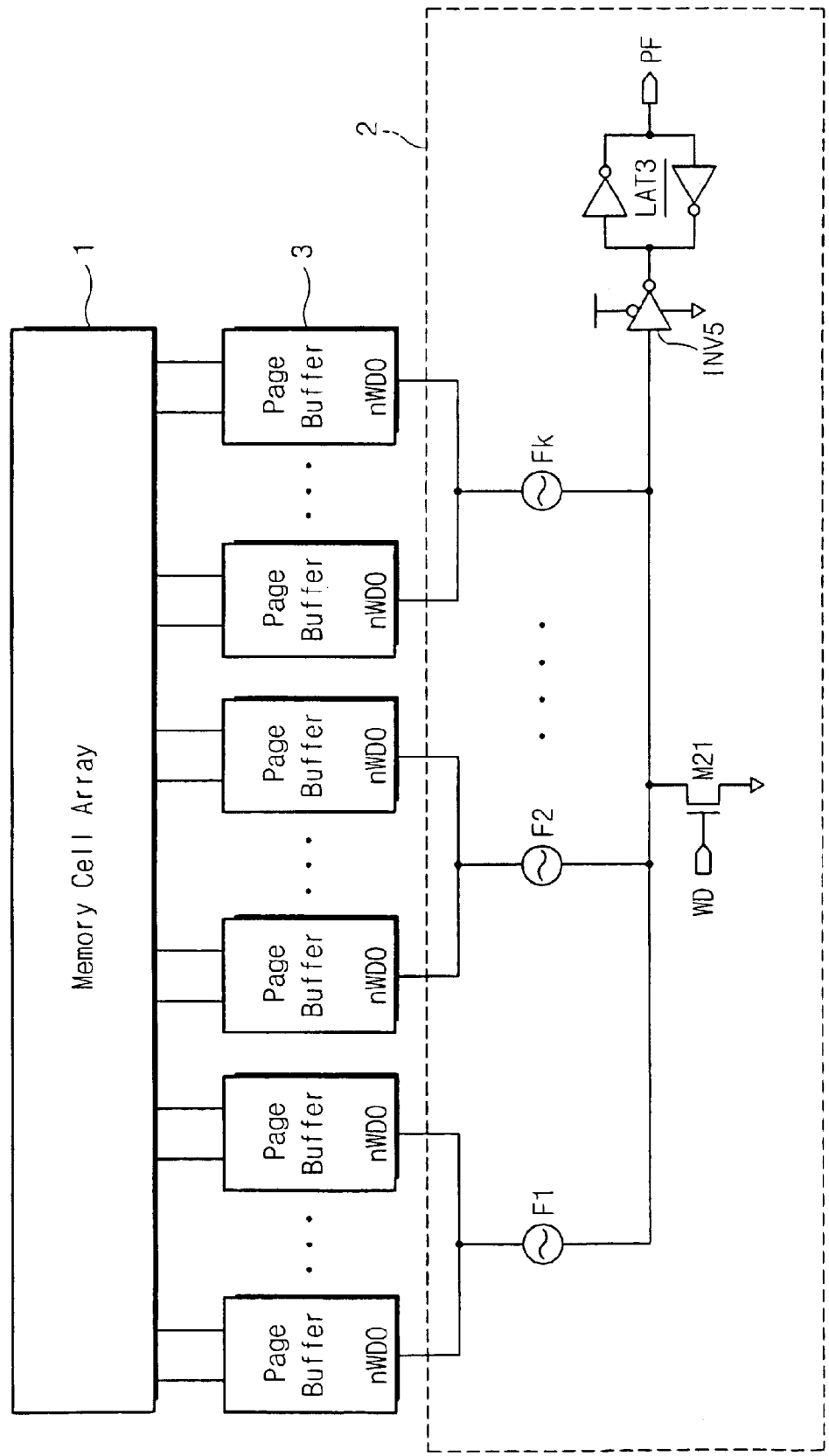
FIG. 2 is a schematic block diagram of a conventional pass/fail check circuit employed in a NAND flash memory.
Figure 7:
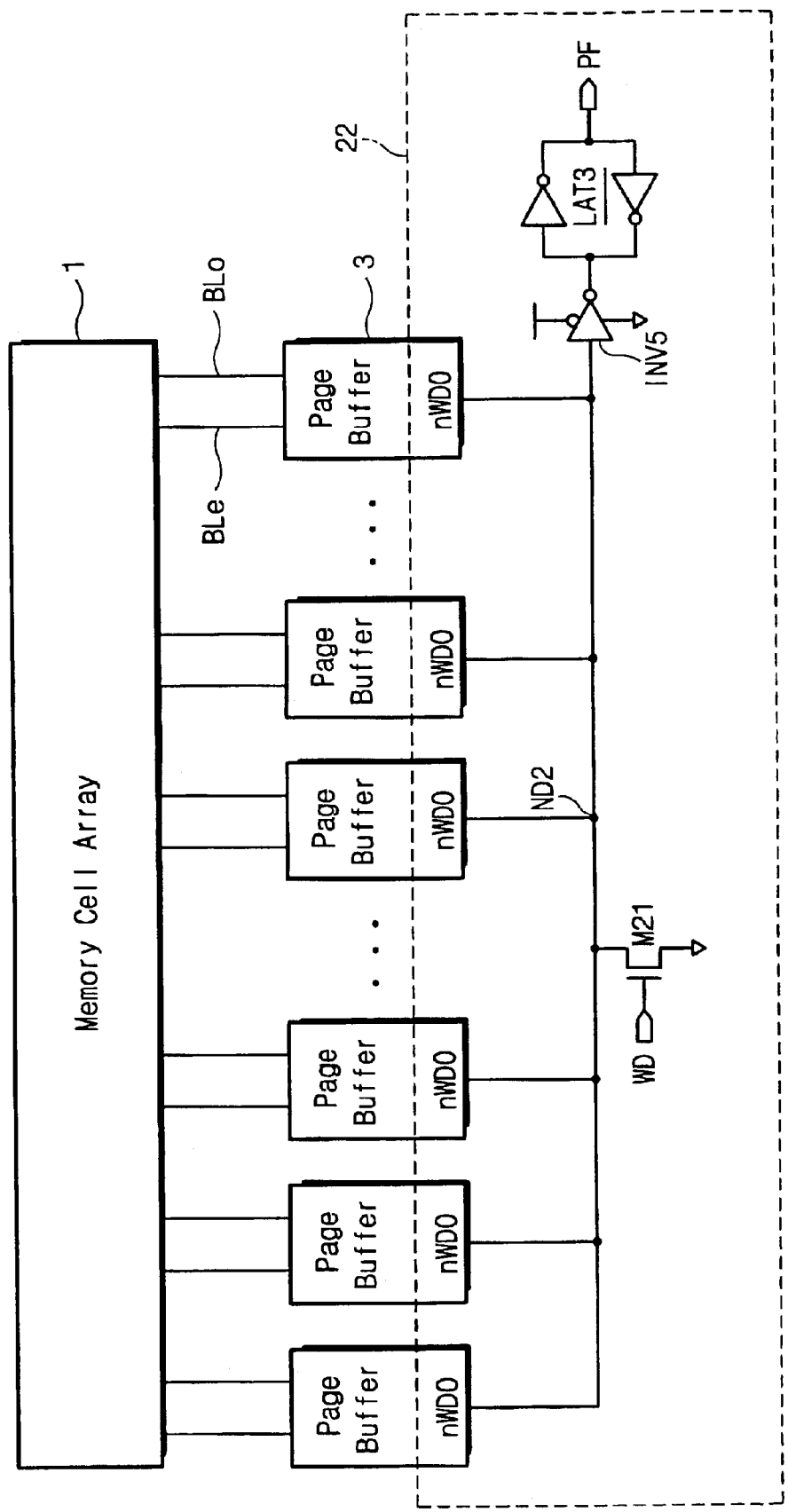
FIG. 7 is a circuit diagram of a pass/fail check circuit that can be used in the circuit of FIG. 3.

The pass/fail check circuit 22 determines whether memory cells have been completely programmed or erased in accordance with data of the main latches LAT1 of the page buffer circuit 130. Referring to FIG. 7, the illustrated pass/fail check circuit 22 differs from that shown in FIG. 2 in its absence of the fuses. Without the traditional fuses that protect column fails in accordance with pass/fail verifying results, there is no influence of a data bit latched in the page buffer from a condition of pass/fail verifying results. That is because a pass data bit is put into the main latch LAT1, instead of a program data bit, corresponding to a defective column, settling the topological disadvantages owing to the fuse arrangement.

In the NAND flash memory according to embodiments of the invention, since a pass data bit is loaded into a page buffer corresponding to a defective column by way of column address information during a program data bit being put into a page buffer, the data bit latched in the page buffer of the defective column does not affect a pass/fail verifying result in the condition without fuses.

The NAND flash memory according to embodiments of the invention executes a sensing operation in a copy-back program mode and before an erasure verifying operation after an erasure operation, and loads a pass data bit in a page buffer corresponding to a defective column before a program operation. Hereinafter are described operations of programming, erasing, and copy-back programming in more detail.

Figure 8:
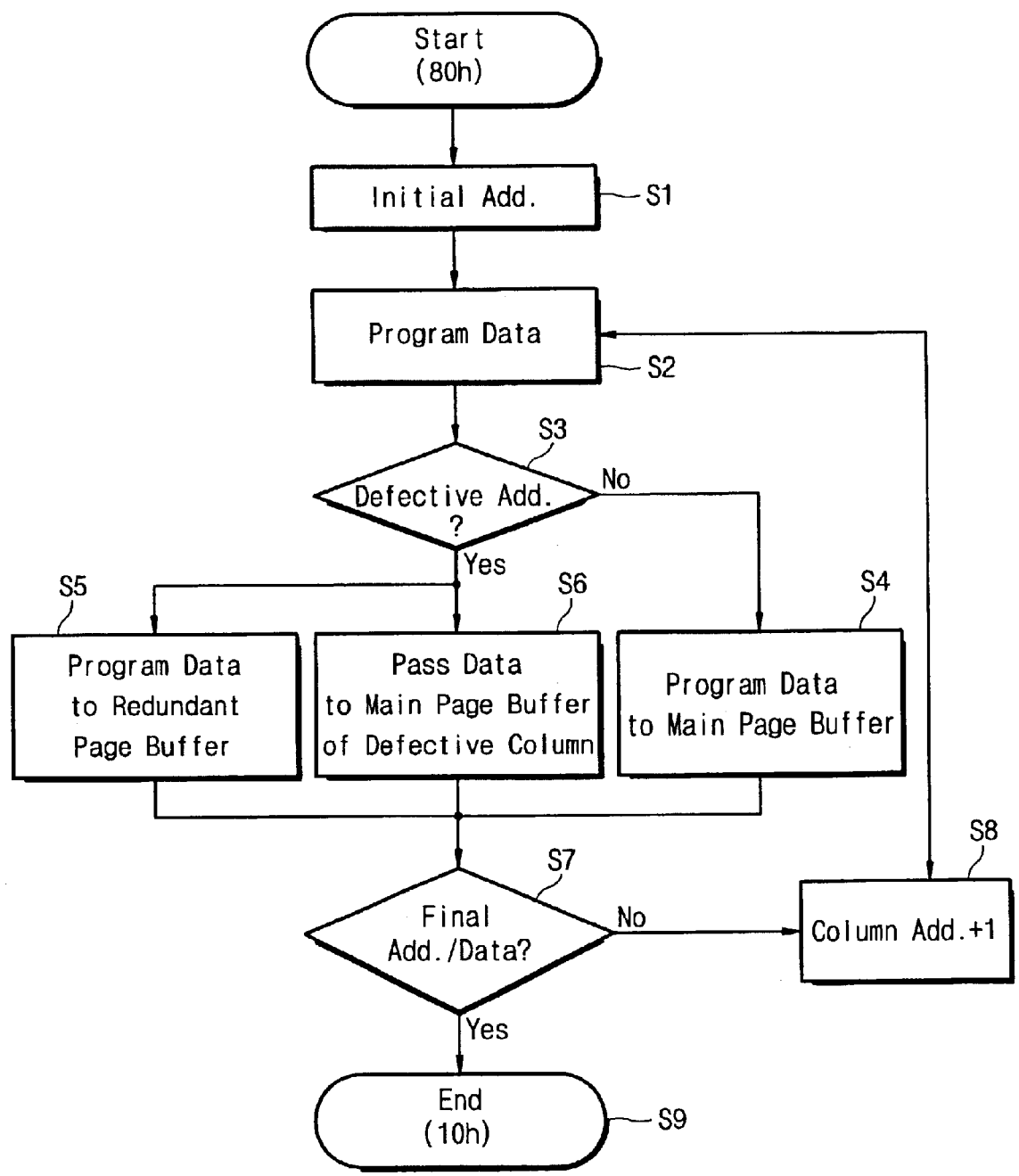
FIG. 8 is a flow chart of programming that can be performed in the NAND flash memory of FIG. 3.

In a program operation, referring to FIG. 8, while program data bits are being loaded in the page buffer circuit 13 from an external source, a pass data bit is put into a page buffer corresponding to a defective column in response to a defective column address, instead of a program data bit. The program data bit corresponding to the defective column is copied in a redundant page buffer.

Once a command (for instance 80h; a hexadecimal code) for a program mode is introduced thereto, an initial address containing row and column information is provided into the memory in accordance with a predetermined address latch enable cycle at a step S1. At this time, the caching into latch LAT2 of the page buffer circuit 13 is initiated by a low-level activation of the control signal PBSET before the loading of the program data bit. In a step S2, program data bits in the unit of byte/word are applied to the data input buffer 19 in response to transitions of a write enable signal nWEx. The program data bits are transferred to the page buffer circuit 13 through the first data loading circuit 20. The redundancy circuit 16 determines if a present column address is the one of a defective column in a step S3. If the present column address is not a defective one, the program data bits applied to the data input buffer 19 are loaded into their corresponding page buffers through the first data loading circuit 20 at a step S4. The process for loading the program data bits in the page buffers is the same as described above.

If the present column address is a defective one, the redundancy circuit 16 activates one of the redundant selection signals CRi. The first data loading circuit 20 transfers a pass data bit "1" to the page buffer circuit 13, simultaneously with isolating a transmission of a program data bit corresponding to a defective column, in response to the active redundant selection signal at a step S5. As stated above, the program data bit is loaded in the cache latch LAT2 by selectively activating the data signals DLi and nDLi and connecting the data lines to the ground voltage. If the present column address designates a defective column, the pass data bit "1" is put into the cache latch LAT2, by making the data signals DI and nDI become "1" and "0" respectively. At the same time, a program data bit corresponding to the defective column is loaded in the redundant page buffer corresponding thereto through the second data loading circuit 21 at a step S6.

In a step S7, it determines if a present column address (or a present program data bit) is the last one. If the present column address is not the last one, the address counter 15 generates the next address at a step S8 and the procedure returns to the step S2 for inputting a new program data bit. The steps from S2 to S8 are repeated until a present column address (or a program data bit) reaches the last one. If the present column address is the last one, the program data loading process terminates. The program data bits loaded into the cache latches LAT2 are transferred to the main latches LAT1 by the above-described way. After that, responding to a command (10h) introduced together with the termination of the program data loading at a step S9, a well-known program operation begins with the loaded program data bits for a selected page.

After programming the loaded data bits in a selected page, it proceeds to a program verifying operation to check that the program data bits are successively written in the selected page. Without an absence of data detected from the selected page, the program verifying operation is carried out by the main latch LAT1 in the same procedure as the read operation. Data bits detected are transferred to the pass/fail check circuit 22 that finds the memory cells of the selected page have been programmed with normal conditions, as follows.

First, bitlines assigned to the selected page are made to float after charged up to a predetermined voltage. Thereby, voltages of the bitlines would increase or decrease responding to a state (programmed or erased) of a selected memory cell. Referring to FIG. 1, with a turn-on of the NMOS transistor M1, the PMOS transistor M5 supplies a current to the sensing node SO. The current into the sensing node SO is discharged through a selected memory cell if it is an on-cell by erasing, causing a voltage of the node SO to be lower than a threshold voltage of the NMOS transistor M7. The main latch LAT1 maintains a present state even though the NMOS transistor M8 is turned on. If a selected memory cell is an off-cell (or has been programmed enough), a current through the PMOS transistor M5 gradually raises a voltage of the sensing node SO. The voltage at the sensing node SO increases over the threshold voltage of the NMOS transistor M7, so that the main latch LAT1 holds a pass data bit "1" when the NMOS transistor M8 is turned on.

The data bit held in the main latch LAT1 is transferred to the pass/fail check circuit 22 through the PMOS transistor M9. For instance, when the main latch LAT1 stores a pass data bit "1" in the latch node B, the PMOS transistor M9 is turned off to make node ND2 retain a low level. It results in the pass/fail signal PF having a low level, informing of a successive program for a presently loaded program data bit. Otherwise, the main latch LAT1 holds "0" as a fail data bit at the latch node B, the PMOS transistor M9 is turned on to charge the node ND2 up to the power supply voltage, resulting in the pass/fail signal PF of a high level, informing of an insufficient program for the loaded data bit.

In the condition of the low-leveled pass/fail signal PF, informing of a sufficient program for a presently loaded program data bit, the next program data bits loaded on the cache latch LAT2 will be written in a newly selected page. And, during programming with program data bits for a selected page, the new program data bits are loaded in the cache latches LAT2. When the pass/fail signal PF is a high level to inform of an insufficient program result for a currently loaded program data bit, program cycles are repeated for the insufficiently programmed page until the pass/fail signal PF becomes a low level or in a predetermined number of the program cycles.

Even without the conventional fuses for excluding defective columns, a data bit held in the page buffer corresponding to a defective column does not affect a pass/fail verifying result because a pass data bit is settled in the page buffer of the defective column by way of defective column information during a loading operation of a program data bit. As a result, the present scheme is free from the topological disadvantages due to a presence of the traditional fuse arrangement and also from degradation of redundancy efficiencies.

Figure 9:
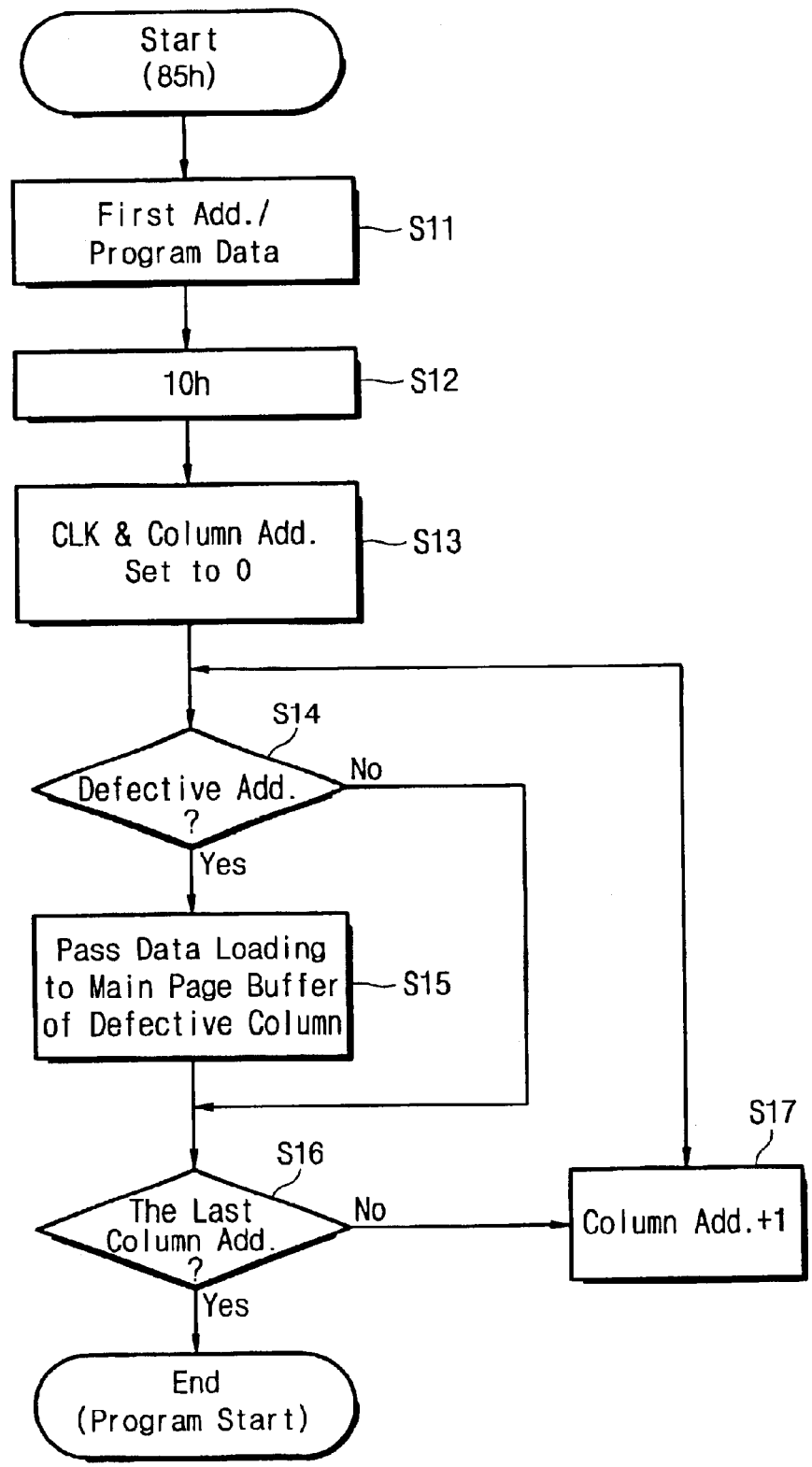
FIG. 9 is a flow chart of copy-back programming that can be performed in the NAND flash memory of FIG. 3.

FIG. 9 shows a procedure of a copy-back program operation according to embodiments of the invention. The copy-back program mode stores data of a page into another page, having operational periods of sensing, pass data loading, data dumping, programming, and program-verifying. During the sensing period, the cache latches LAT2 detect data stored in memory cells of a page in the manner described above. After completing the sensing operation by way of the cache latches LAT2, the sensed data bits are written in another page. In the present embodiment, a pass data bit is loaded in a page buffer corresponding to a defective column before the detected data bits are written in another page, as shown in FIG. 9.

First, a command signal of, for example, 85h (hexadecimal code) is introduced to begin a copy-back program mode. The command signal of 85h does not initiate the cache latches LAT2 like the command signal of 80h beginning the program mode, which aims to prevent variations of the latched data bits to be written into another page. In order to partially rewrite the data bits loaded in the cache latches LAT2, first address and program data bits are sent to the page buffer circuit 13 by way of the data input buffer 19 and the first data loading circuit 20 in a step S11, in the same manner described above. During this, a program data bit corresponding to a defective column is put into the redundant page buffer through the second loading circuit 21, according to the embodiment of the invention.

Next, responding to a command signal of, for example, 10h (hexadecimal code) received in a step S12, it sets a column address "0" of the address counter 15 by generating an internal oscillation enable signal in a step S13. A step S14 determines if a column address supplied from the address counter 15 is a defective column. If the column address from the address counter 15 is defective, the redundancy circuit 160 activates one of the redundant selection signals CRi. The first data loading circuit 20 outputs the data signals DLi and nDLi each with high (as a pass data bit "1") and low levels, responding to the active redundant selection signal. During this, the grounded data line DLi is electrically connected to the node ND1 by way of the column gate circuit 18. With those conditions, the pass data bit "1" is loaded on the latch node A of the cache latch LAT2 in a step S15.

If a column address from the address counter 15 is not designating a defective column, it proceeds a step S16 to determine if the column address presently provided from the address counter 15 is the last. When the current column address is not final, the address counter 15 increases the column address by "1" in the step S17. The steps S14 through S17 are repeated until a column address from the address counter 15 comes to the last one. After the iterative routines, a pass data bit of "1" is settled in a page buffer corresponding to a defective column. When there is a final column address at the step S16, an operation for loading pass data is completed, and then a program operation begins.

After the procedure of FIG. 9, program data bits held in the cache latches LAT2 are transferred to the main latches LAT1 to be written in another page (hereinafter referred to "the second page"). Then, the pass/fail check circuit 22 evaluates a program result for the second page, "pass" or "fail", which is substantially identical to the former program-verifying operation. As same as the program operation, the copy-back program-verifying operation is also carried out without fuses in the fuse-free pass/fail check circuit 22.

As shown in FIG. 9, the data bits to be partially rewritten are loaded in the cache latches LAT2 before the command signal 10h after the command signal 85h. While this occurs, the address initially introduced thereto from outside the memory device contains row and column information while the next addresses only includes column information, which arises because the copy-back operation is involved in one page.

Figure 10:
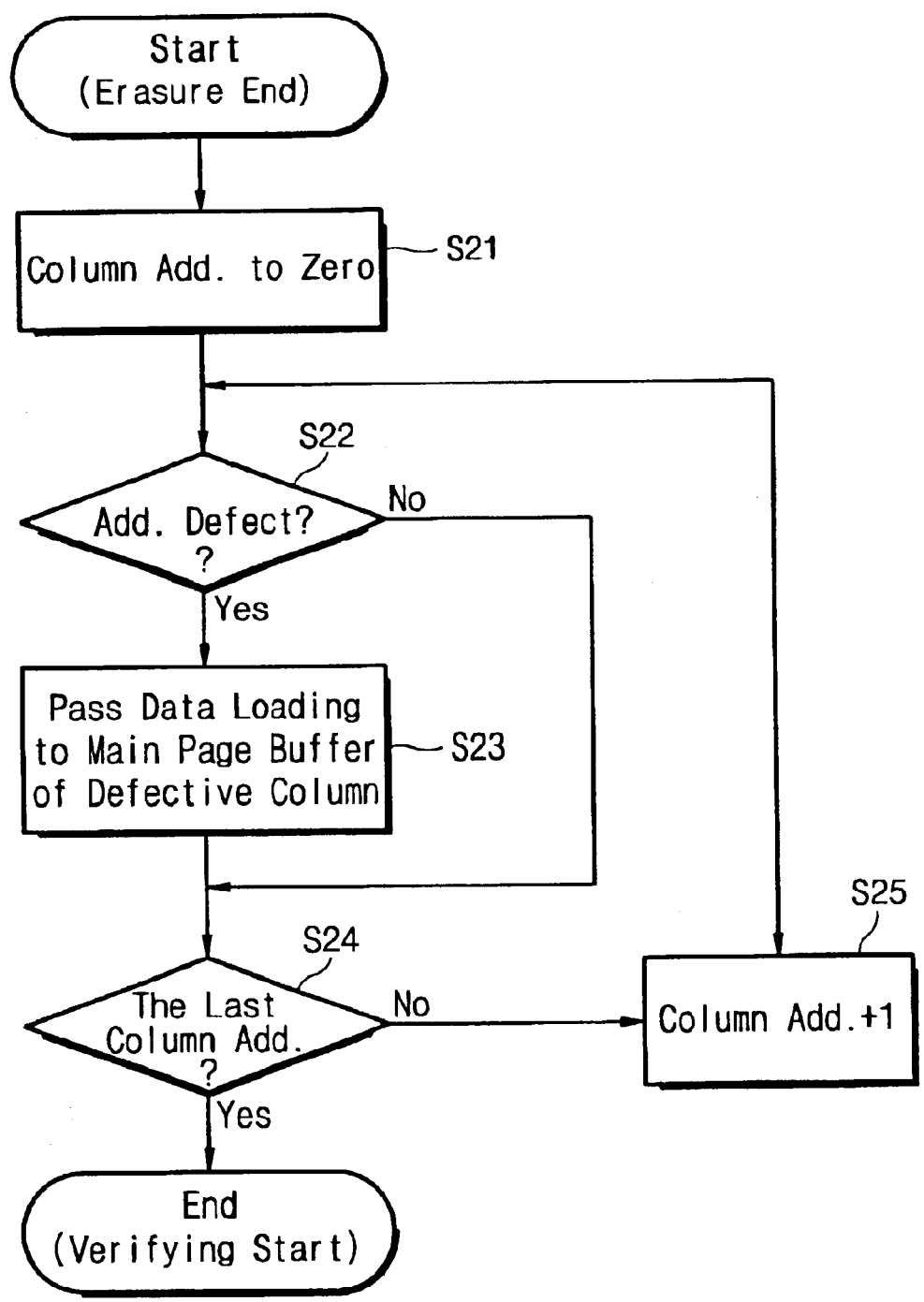
FIG. 10 is a flow chart of erasing that can be performed in the NAND flash memory of FIG. 3.

FIG. 10 explains a flow of erasing in accordance with embodiments of the invention. An erasure mode is operatively composed of periods of erasing, pass data loading, and erasure verifying. During the erasure mode, a pass data bit is stored in a page buffer corresponding to a defective column before the erasure verifying operation starts to ensure memory cells have been erased in the former erasing cycles without failures.

After erasing, referring to FIG. 10, the address counter 15 sets a column address to "0" in a step S21. The next step S22 determines whether the column address generated from the address counter 15 is one corresponding to a defective column. If the address from the address counter 15 is defective, the redundancy circuit 16 activates one of the redundant selection signals CRi. The first data loading circuit 20 outputs the data signals DLi and nDLi each with high (as a pass data bit "1") and low levels, responding to the active redundant selection signal. During this, the grounded data line DLi is electrically connected to the node ND1 by way of the column gate circuit 18. With those conditions, the pass data bit "1" is loaded in the latch node A of the cache latch LAT2 in a step S23.

If a column address from the address counter 15 is not one designating a defective column, it proceeds a step S24 to determine if a column address presently provided from the address counter 15 is the last one. If the current column address is not final, the address counter 15 increases the column address by "1" in the step S25. The steps S22 through S25 are repeated until a column address from the address counter 15 is the last one. After the iterative routines from the step S22 to the step S25, a pass data bit of "1" is stored in a page buffer corresponding to a defective column. When the final column address is detected at the step S24, an operation for loading pass data is completed and then a program-verifying operation begins.

The data bits loaded in the cache latches LAT2 are transferred to the main latches LAT1 in the aforementioned data transmission process and the pass/fail check circuit 22 outputs the pass/fail signal PF from the transferred data bits. Those operations of data transferring and pass/fail checking are the same as described above with reference to the aforementioned program-verifying operations. Same as the program mode, the erasure verifying operation is also carried out without fuses in the fuse-free pass/fail check circuit 22. And, the pass data loading and verifying operations are repeated until all pages are selected in the erasure mode.

It is possible to shorten the time of loading pass data bits in the erasure mode or the copy-back program mode by utilizing an accelerated column scanning scheme, for example one as described in U.S. patent application Ser. No. 10/197,098, filed on Jul. 16, 2002 entitled NON-VOLATILE SEMICONDUCTOR MEMORY DEVICE WITH ACCELERATED COLUMN SCANNING SCHEME assigned to the assignee of the present invention and incorporated herein in its entirety for all purposes, which extends an internal data bus width to more than a data input/output width.

As described above, the present NAND flash memory employs a fuse-free pass/fail check circuit by loading a pass data bit in a page buffer corresponding to a defective column, which overcomes disadvantages of larger circuit topologies and redundancy efficiencies due to a fuse arrangement. In a program mode, a pass data bit is put into a page buffer corresponding to a defective column during a program data loading period. In an erasure, or a copy/back program mode, a pass data bit is loaded on a page buffer corresponding to a defective column before a sensed data bit is transferred to a main latch from a cache latch.

Specific examples of embodiments of the invention are now described, giving examples of how the invention can be embodied. According to aspects of the present invention, a nonvolatile memory, including a cell array of a plurality of memory cells arranged in a matrix of rows and columns, being conductive in operation modes of programming, reading, copy-back programming, and erasing is provided. The nonvolatile memory includes: a clock generator for creating a clock signal operable in the operation modes; an address generator for creating column addresses in response to the clock signal; a page buffer circuit including a plurality of page buffers corresponding to the columns, each page buffer including main and cache latches; a column selection circuit for selecting a part of the page buffers and for connecting the selected page buffers to data lines corresponding to cache latches of the selected page buffers; and a way to control the data loading circuit in response to the column addresses, by which a pass data bit is loaded on the cache latch of the selected page buffer connected to a defective column, instead of a program data bit of the defective column, when one of the column addresses designates the defective column during the programming operation mode.

The way to control the data loading circuit comprises a redundancy circuit for storing address information involved in the defective column, and for activating one of redundant selection signals when the column address designates the defective column.

The clock signal regulates the column addresses to be generated in series before a verifying operation begins after erasing the memory cells; and the pass data bit is loaded on the cache latch of the selected page buffer connected to the defective column in response to the active one of the redundant selection signals. Otherwise, the clock signal regulates the column addresses to be generated in series before data bits sensed and held in the cache latches are transferred to the main latches of the page buffers; and the pass data bit is loaded on the cache latch of the selected page buffer connected to the defective column in response to the active one of the redundant selection signals. The clock signal is generated responding to an internal oscillation enable signal, or responding to logic transitions of a write enable signal during the programming operation mode.

In practice, an example way to control the data loading circuit includes: a redundant cell array including redundant memory cells arranged in a matrix of the rows and redundant columns; redundant page buffers each corresponding to the redundant columns, each redundant page buffer including a redundant main latch and redundant cache latch; and a redundant data loading circuit for putting the program data bit corresponding to the defective column into the redundant cache latch of one of the redundant page buffers in response to the redundant selection signal.

Other examples of a nonvolatile memory further includes a pass/fail check circuit for determining that data bits of the main latches of the page buffers are pass data bits during a verifying period of the programming, erasing, or copy-back programming operation mode. The pass/fail check circuit, as a fuse-free type, includes: an internal node connected to the PMOS transistors of the page buffers in common; a discharge transistor for connecting the internal node to a ground voltage in response to a discharge control signal; and a latch for holding a logic state of the internal node and for outputting a pass/fail signal.

Each page buffer can include a PMOS transistor connecting a power supply voltage to the pass/fail check circuit in response to a data bit storing in the main latch of the page buffer corresponding thereto.

A method of programming data in a nonvolatile memory having a main cell array of memory cells arranged in a matrix of rows and first columns, a redundant cell array of redundant memory cells arranged in a matrix of the rows and second columns, and page buffers corresponding to the first and second columns, each page buffer including main and cache latches, can include, for example: receiving a program data bit after an initial address input; finding a column address of the initial address is an address to select a defective one among the first columns; loading a pass data bit on the cache latch of the page buffer corresponding to the defective column when the column address is assigned to the defective column; finding the column address is the last one; increasing the column address by one when the column address is not the last one; and repeating the former steps until the column address reaches the last one.

In the programming mode, a program data bit corresponding to the defective column is loaded on the cache latch of the page buffer corresponding to the second column, while the pass data bit is being loaded on the cache latch of the page buffer connected to the defective column. The program data bit is loaded on the page buffer corresponding to the first column if the column address is not an address of the defective column. And, the program data bits loaded on the cache latches are transferred to the main latches to program the main and redundant cell arrays.

A method of copy-back programming data in a nonvolatile memory having a main cell array of memory cells arranged in a matrix of rows and first columns, a redundant cell array of redundant memory cells arranged in a matrix of the rows and second columns, and page buffers corresponding to the first and second columns, each page buffer including main and cache latches, can include, for example: establishing a column address on "0" after sensing and holding page data of the first column by means of the cache latches; finding the column address is an address to select a defective one among the first columns; loading a pass data bit on the cache latch of the page buffer corresponding to the defective column when the column address is assigned to the defective column; determining if the column address is the last one; increasing the column address by one when the column address is not the last one; and repeating the former steps until the column address reaches the last one.

In the copy-back programming mode, it also determines the column address is the last one when the column address is not an address to select the defective column. The program data bits of the cache latches are transferred to the main latches to program the main and redundant cell arrays when the column address is the last one.

A method of erasing data in a nonvolatile memory having a main cell array of memory cells arranged in a matrix of rows and first columns, a redundant cell array of redundant memory cells arranged in a matrix of the rows and second columns, and page buffers corresponding to the first and second columns, each page buffer including main and cache latches, can include, for example: sensing page data by way of the cache latches after erasing the main and redundant cell arrays; establishing a column address on "0"; determining if the column address is an address to select a defective one among the first columns; loading a pass data bit on the cache latch of the page buffer corresponding to the defective column when the column address is assigned to the defective column; determining if the column address is the last one; increasing the column address by one when the column address is before the last one; and repeating the former steps until the column address reaches the last one.

In the erasing mode, it also finds the column address is the last one when the column address is not an address to select the defective column.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. A nonvolatile memory, including a cell array of a plurality of memory cells arranged in a matrix of rows and columns, being conductive in operation modes of programming, reading, copy-back programming, and erasing, the memory comprising:
   a clock generator for creating a clock signal operable in the operation modes;
   an address generator for creating column addresses in response to the clock signal;
   a page buffer circuit including a plurality of page buffers corresponding to the columns, each page buffer including main and cache latches;
   a column selection circuit for selecting a part of the page buffers and for connecting the selected page buffers to data lines corresponding to the selected page buffers;
   a data loading circuit for putting external program data bits into the cache latches of the selected page buffers; and
   a control circuit structured to control the data loading circuit in response to the column addresses, in which a pass data bit is loaded in the cache latch of a selected page buffer connected to a defective column, instead of a program data bit of the defective column, when one of the column addresses designates the defective column during the programming operation mode.

2. The memory of claim 1, wherein the control circuit comprises a redundancy circuit for storing address information of the defective column, and for activating one of redundant selection signals when the column address designates the defective column.

3. The memory of claim 2, wherein the clock signal regulates the column addresses to be generated in series, before a verifying operation begins after erasing the memory cells; and the pass data bit is loaded in the cache latch of the selected page buffer connected to the defective column in response to the active one of the redundant selection signals.

4. The memory of claim 3, wherein the clock signal is generated in response to an internal oscillation enable signal.

5. The memory of claim 2, wherein the clock signal regulates the column addresses to be generated in series, before data bits sensed and held in the cache latches are transferred to the main latches of the page buffers; and the pass data bit is loaded in the cache latch of the selected page buffer connected to the defective column in response to the active one of the redundant selection signals.

6. The memory of claim 2, wherein the control circuit comprises:
   a redundant cell array including redundant memory cells arranged in a matrix of the rows and redundant columns;

redundant page buffers each corresponding to the redundant columns, each redundant page buffer including a redundant main latch and redundant cache latch; and a redundant data loading circuit for putting the program data bit corresponding to the defective column into the redundant cache latch of one of the redundant page buffers in response to the redundant selection signal.

7. The memory of claim 6, further comprising a pass/fail check circuit for determining whether data bits of the main latches of the page buffers are pass data bits during a verifying period of the programming, erasing, or copy-back programming operation mode.

8. The memory of claim 7, wherein each of the page buffers comprises a PMOS transistor for connecting a power supply voltage to the pass/fail check circuit in response to a data bit storing in the main latch of the page buffer corresponding thereto.

9. The memory of claim 8, wherein the pass/fail check circuit comprises:

an internal node connected to the PMOS transistors of the page buffers in common;

a discharge transistor for connecting the internal node to a ground voltage in response to a discharge control signal; and a latch for holding a logic state of the internal node and for outputting a pass/fail signal.

10. The memory of claim 1, wherein the clock signal is generated responding to logic transitions of a write enable signal during the programming operation mode.

11. A method of programming data in a nonvolatile memory having a main cell array of memory cells arranged in a matrix of rows and first columns, a redundant cell array of redundant memory cells arranged in a matrix of the rows and second columns, and page buffers corresponding to the first and second columns, each page buffer including main and cache latches, the method comprising:

receiving a program data bit after an initial address input;

determining whether a column address of the initial address is an address to select a defective one among the first columns;

loading a pass data bit in the cache latch of the page buffer corresponding to the defective column when the column address is assigned to the defective column;

determining if the column address is a last one;

increasing the column address by one when the column address is before the last one; and repeating the former processes until the column address reaches the last one.

12. The method of claim 11, wherein a program data bit corresponding to the defective column is loaded in the cache latch of the page buffer corresponding to the second column while the pass data bit is being loaded in the cache latch of the page buffer connected to the defective column.

13. The method of claim 11, wherein the program data bit is loaded in the page buffer corresponding to the first column if the column address is not an address of the defective column.

14. The method of claim 11, wherein the program data bits loaded in the cache latches are transferred to the main latches to program the main and redundant cell arrays.

15. A method of copy-back programming data in a nonvolatile memory having a main cell array of memory cells arranged in a matrix of rows and first columns, a redundant cell array of redundant memory cells arranged in a matrix of the rows and second columns, and page buffers corresponding to the first and second columns, each page buffer including main and cache latches, the method comprising:

establishing a column address of "0" after sensing and holding page data of the first column by way of the cache latches;

determining if the column address is an address to select a defective one among the first columns;

loading a pass data bit in the cache latch of the page buffer corresponding to the defective column when the column address is assigned to the defective column;

determining if the column address is a last one;

increasing the column address by one when the column address is before the last one; and repeating the former processes until the column address reaches the last one.

16. The method of claim 15, further comprising:

determining that the column address is the last one when the column address is not an address to select the defective column.

17. The method of claim 15, wherein the program data bits of the cache latches are transferred to the main latches to program the main and redundant cell arrays when the column address is the last one.

18. A method of erasing data in a nonvolatile memory having a main cell array of memory cells arranged in a matrix of rows and first columns, a redundant cell array of redundant memory cells arranged in a matrix of the rows and second columns, and page buffers corresponding to the first and second columns, each page buffer including main and cache latches, the method comprising:

sensing page data by way of the cache latches after erasing the main and redundant cell arrays;

establishing a column address of "0";

determining if the column address is an address to select a defective one among the first columns;

loading a pass data bit on the cache latch of the page buffer corresponding to the defective column when the column address is assigned to the defective column;

determining the column address is a last one;

increasing the column address by one when the column address is before the last one; and repeating the former processes until the column address reaches the last one.

19. The method of claim 18, further comprising:

determining that the column address is the last one when the column address is not an address to select the defective column.

* * * * *